United States Patent
Jang et al.

(10) Patent No.: US 12,396,160 B2
(45) Date of Patent: Aug. 19, 2025

(54) METHOD FOR FABRICATING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Semyeong Jang, Hefei (CN); Deyuan Xiao, Hefei (CN); Joonsuk Moon, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 499 days.

(21) Appl. No.: 17/892,135

(22) Filed: Aug. 22, 2022

(65) Prior Publication Data
US 2022/0399347 A1 Dec. 15, 2022

(30) Foreign Application Priority Data
Oct. 27, 2021 (CN) .......................... 202111252372.X

(51) Int. Cl.
*H10B 12/00* (2023.01)
*H01L 23/522* (2006.01)
*H01L 23/528* (2006.01)
*H01L 23/532* (2006.01)

(52) U.S. Cl.
CPC ....... *H10B 12/482* (2023.02); *H01L 23/5222* (2013.01); *H01L 23/5226* (2013.01); *H01L 23/5283* (2013.01); *H01L 23/53271* (2013.01); *H01L 23/53295* (2013.01)

(58) Field of Classification Search
CPC .............. H10B 12/482; H01L 23/5222; H01L 23/5226; H01L 23/5283; H01L 23/53271; H01L 23/53295
USPC ........................................................ 257/297
See application file for complete search history.

(56) References Cited

U.S. PATENT DOCUMENTS

| | | | | |
|---|---|---|---|---|
| 2014/0061850 A1* | 3/2014 | Cho | ....... | H01L 21/764 |
| | | | | 257/506 |
| 2016/0307999 A1* | 10/2016 | Kim | ....... | H10D 62/116 |
| 2023/0098062 A1* | 3/2023 | Sukekawa | ....... | H10B 12/03 |
| | | | | 257/296 |

* cited by examiner

*Primary Examiner* — Tu-Tu V Ho
(74) *Attorney, Agent, or Firm* — Kilpatrick Townsend & Stockton LLP

(57) ABSTRACT

Embodiments provide a method for fabricating a semiconductor structure and a semiconductor structure. The method for fabricating a semiconductor structure provided by the present disclosure includes: providing a substrate, the substrate being provided with first trenches arranged in a same direction; forming protective layers on side walls of the first trenches; forming second trenches at bottoms of the first trenches, the second trenches being wider than the first trenches; forming first spacers on side walls of the second trenches to reduce opening sizes of the second trenches; filling the first trenches and the second trenches to form second spacers, and forming voids in the second trenches; forming third trenches in the substrate, the third trenches being perpendicular to the first trenches; and forming bit lines in the third trenches.

17 Claims, 16 Drawing Sheets

METHOD FOR FABRICATING SEMICONDUCTOR STRUCTURE AND SEMICONDUCTOR STRUCTURE

CROSS-REFERENCE TO RELATED APPLICATION

This application claims priority to Chinese Patent Application No. 202111252372.X, titled "METHOD FOR FABRICATING SEMICONDUCTOR STRUCTURE AND SEMICONDUCTOR STRUCTURE" and filed to the State Patent Intellectual Property Office on Oct. 27, 2021, the entire contents of which are incorporated herein by reference.

TECHNICAL FIELD

The present disclosure relates to the field of semiconductors, and more particularly, to a method for fabricating a semiconductor structure and a semiconductor structure.

BACKGROUND

As an important circuit commonly used in electronic devices, a dynamic random access memory (DRAM) is generally used for data access. The DRAM is generally used as a main memory of a computer because of its advantages such as lower power consumption and higher integration level. The DRAM can only keep data for a short time. To keep the data, the DRAM needs to be refreshed at intervals. A basic subcircuit of the DRAM includes one transistor and one capacitor. If there is leakage in the capacitor, insufficient charges may lead to data errors. To replenish missing charges in time to avoid loss of stored information, a gate capacitor needs to be replenished with charges regularly, so the capacitor needs to be periodically refreshed. Once a memory cell is not refreshed, the data may be lost.

Data retention time of the DRAM may be limited by a leakage current. There are two main leakage mechanisms having a negative effect on the data retention time of the DRAM. One is leakage of a transistor cell in the DRAM. The leakage of the transistor cell in the DRAM is mainly caused by a gate-induced drain leakage (GIDL) current, which is a leakage current caused by a high electric field effect at a drain junction. Under negative gate bias, a gate may generate one depletion region, one enhanced electric field is generated in the depletion region, and band bending caused by this electric field results in band-to-band tunneling. In this case, electrons and minority carriers moving at the gate may tunnel into a drain, causing unnecessary leakage current. The other one is dielectric leakage between a bit line contact structure and a storage node contact structure. The dielectric leakage typically occurs inside the capacitor, where the electrons flow through metal and dielectric regions. The dielectric leakage occurs when the electrons tunnel from one electrode to another one through a dielectric layer. As a process node is reduced, a distance between the bit line contact structure and the storage node contact structure is gradually shortened, so this problem is becoming more and more serious. Fabrication process variations of these structural elements may also negatively affect the dielectric leakage between the bit line contact structure and the storage node contact structure. Another important factor having a negative effect on performance of the DRAM is a parasitic capacitance of a device. Alternating current analysis should be made during development of the DRAM, this is because bit line coupling may cause delay of write recovery time and lead to other performance glitches. Because doped polycrystalline silicon not only is used for transistor gates, but also is used for bit line contacts and storage node contacts, which may lead to a plurality of potential parasitic capacitances.

In the prior art, for semiconductor memories such as the DRAM, a mainstream bit line structure is formed by sequentially filling oxides after bit line channels are etched. After bit line patterns are formed, an oxide structure between adjacent bit lines determines a metal capacitance between the adjacent bit lines. As an important electrical parameter, the parasitic capacitance of the bit lines has a negative effect on stability of the DRAM.

The DRAM has developed so far, how to improve the stability and performance of the DRAM has become a major obstacle to the development of the DRAM.

SUMMARY

A technical problem to be solved by the present disclosure is to provide a method for fabricating a semiconductor structure and a semiconductor structure by introducing spacers having void structures into bit line trenches, to reduce a parasitic capacitance of bit lines and improve electric stability of the semiconductor structure.

The method for fabricating a semiconductor structure provided by the present disclosure includes: providing a substrate, where the substrate is provided with first trenches arranged in a same direction; forming protective layers on side walls of the first trenches; forming second trenches at bottoms of the first trenches, where the second trenches are wider than the first trenches; forming first spacers on side walls of the second trenches to reduce opening sizes of the second trenches; filling the first trenches and the second trenches to form second spacers, and forming voids in the second trenches; forming third trenches in the substrate, where the third trenches are perpendicular to the first trenches; and forming bit lines in the third trenches.

In some embodiments, in the method for fabricating a semiconductor structure, the step of forming bit lines includes: depositing metal layers in the third trenches, and contacting the substrate by means of isotropic diffusion to form metal silicide; and removing unreacted metal layers to form the bit lines.

In some embodiments, in the method for fabricating a semiconductor structure, the third trenches are formed by means of twice expansion.

In some embodiments, in the method for fabricating a semiconductor structure, the protective layers, the first spacers and the second spacers are separately formed by means of physical vapor deposition and/or chemical vapor deposition.

In some embodiments, in the method for fabricating a semiconductor structure, the second trenches are formed by means of isotropic etching.

In some embodiments, in the method for fabricating a semiconductor structure, the second trenches are positioned below the first trenches, and the second trenches are shaped like inverted water drops.

In some embodiments, in the method for fabricating a semiconductor structure, the forming second trenches further includes a cleaning step.

In some embodiments, in the method for fabricating a semiconductor structure, hydrogen fluoride (HF) is used in the cleaning step.

In some embodiments, in the method for fabricating a semiconductor structure, the first trenches and the second trenches are filled by means of step coverage, the first trenches are filled up, and voids are formed in the second trenches.

In some embodiments, in the method for fabricating a semiconductor structure, materials of the protective layers, of the first spacers and of the second spacers are separately selected from silicon oxide, silicon nitride, and silicon oxynitride.

In some embodiments, in the method for fabricating a semiconductor structure, the step of forming protective layers on side walls of the first trenches further includes: growing the protective layers in the first trenches, where the protective layers cover the side walls and bottoms of the first trenches; and removing the protective layers positioned at the bottoms of the first trenches, and retaining the protective layers on the side walls of the first trenches.

To solve the above problem, the present disclosure provides a semiconductor structure, which includes: a substrate, spacers, and bit lines. The substrate is provided with bit line trenches arranged in a same direction, the bit line trenches include first trenches and second trenches, and the second trenches are positioned below the first trenches and are communicated with the first trenches. The spacers are filled into the bit line trenches, and the spacers have voids. The bit lines are arranged between the bit line trenches and are separated by the spacers.

In some embodiments, in the semiconductor structure, the bit line trenches are formed by means of isotropic etching.

In some embodiments, in the semiconductor structure, the second trenches are shaped like inverted water drops.

In some embodiments, in the semiconductor structure, the voids are provided in a part of the spacers of the second trenches.

In some embodiments, in the semiconductor structure, material of the bit lines is metal silicide.

In some embodiments, in the semiconductor structure, the spacers are formed by means of one or more methods of physical vapor deposition, chemical vapor deposition, and step coverage.

In some embodiments, in the semiconductor structure, material of the spacers is selected from silicon oxide, silicon nitride, and silicon oxynitride.

According to the present disclosure, the spacers having the void structures are introduced into the bit line trenches, to reduce the parasitic capacitance of the bit lines and improve the electric stability of the semiconductor structure.

DETAILED DESCRIPTION

Embodiments of the method for fabricating a semiconductor structure and the semiconductor structure provided by the present disclosure will be described in detail below with reference to the accompanying drawings.

Figure 1:
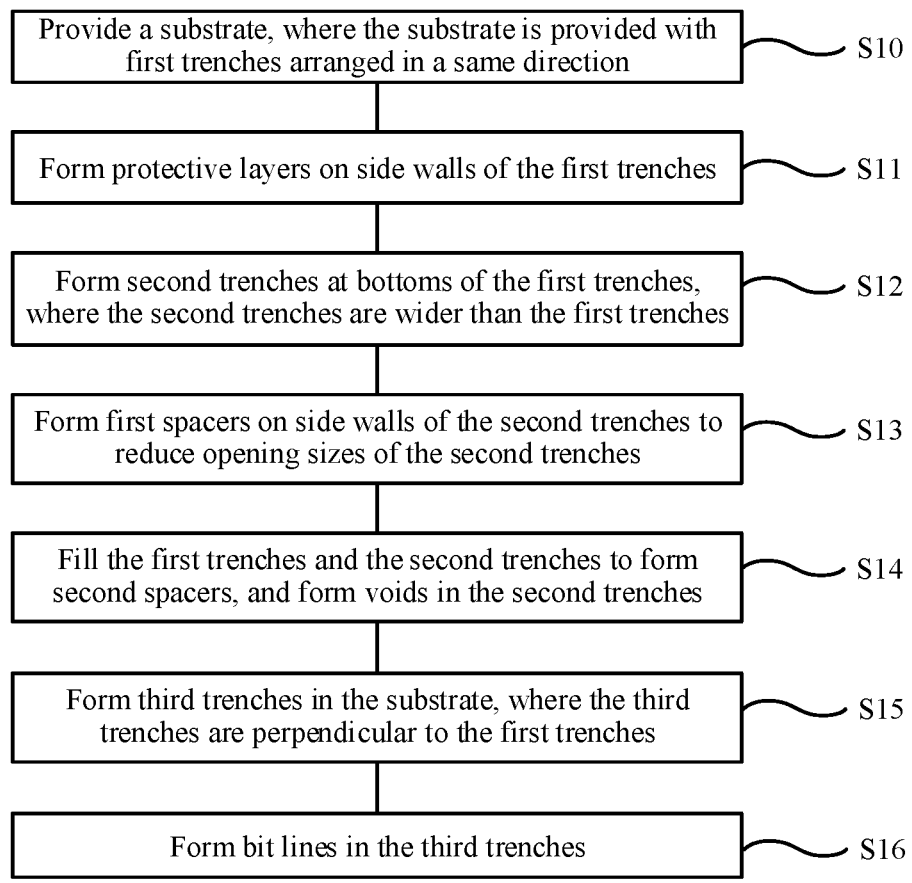
FIG. 1 is a schematic diagram showing steps of a method for fabricating a semiconductor structure according to an embodiment of the present disclosure.

FIG. 1 is a schematic diagram showing steps of a method for fabricating a semiconductor structure according to an embodiment of the present disclosure. The method includes: Step S10, providing a substrate, where the substrate is provided with first trenches arranged in a same direction; Step S11, forming protective layers on side walls of the first trenches; Step S12, forming second trenches at bottoms of the first trenches, where the second trenches are wider than the first trenches; Step S13, forming first spacers on side walls of the second trenches to reduce opening sizes of the second trenches; Step S14, filling the first trenches and the second trenches to form second spacers, and forming voids in the second trenches; Step S15, forming third trenches in the substrate, where the third trenches are perpendicular to the first trenches; and Step S16, forming bit lines in the third trenches.

FIGS. 2A to 2G are schematic process diagrams of Steps S10 to S16 in FIG. 1.

Figure 2A:
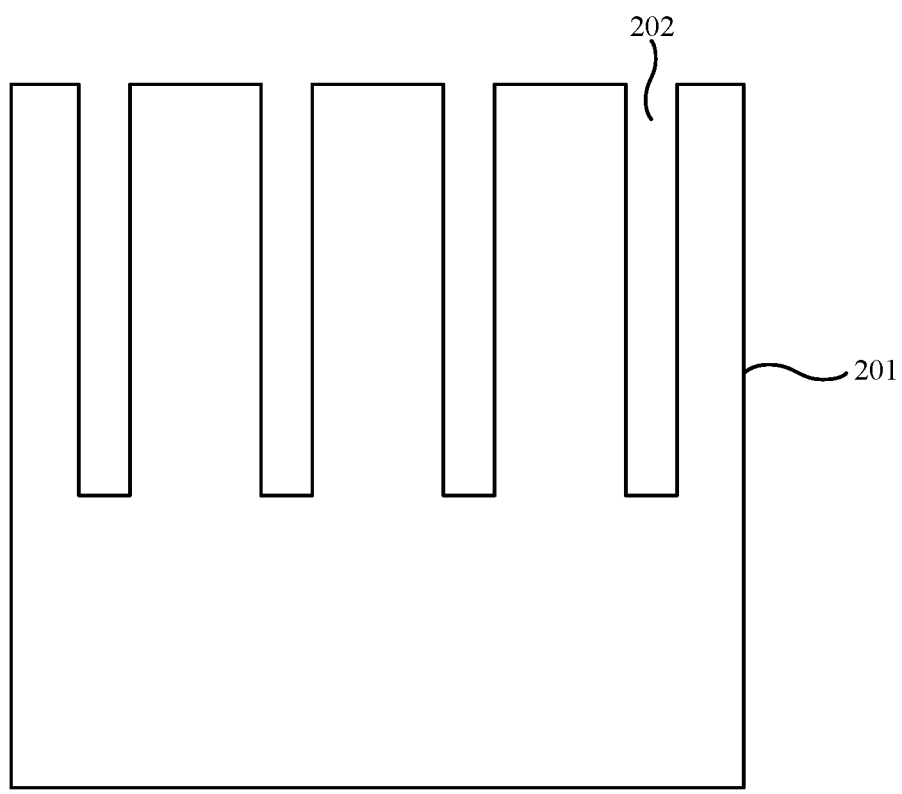
FIGS. 2A to 2G are schematic process diagrams of Steps S10 to S16 in FIG. 1.

As shown in FIG. 2A, referring to Step S10, a substrate 201 is provided, and the substrate 201 is provided with first trenches 202 arranged in a same direction. In an embodiment of the present disclosure, the substrate 201 is a Si substrate. In other embodiments of the present disclosure, the substrate 201 may also be made of common substrate materials in the field of semiconductors such as sapphire, silicon carbide, and gallium nitride. In an embodiment of the present disclosure, the first trenches 202 are obtained by means of dry etching and/or wet etching.

Figure 2B:
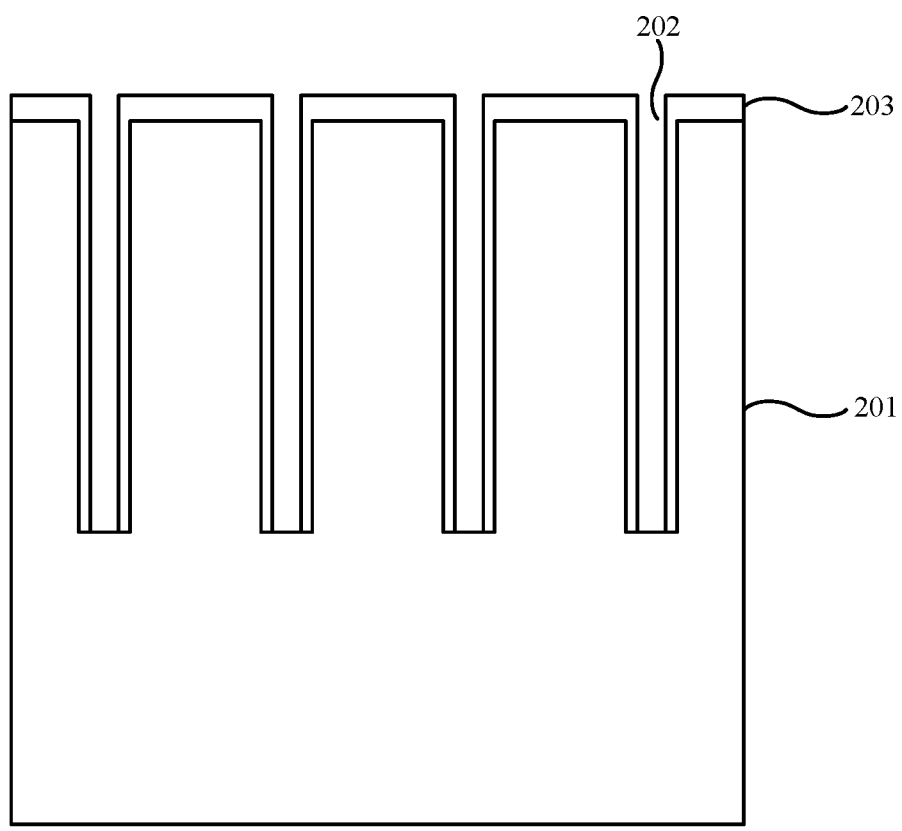

As shown in FIG. 2B, referring to Step S11, protective layers 203 are formed on side walls of the first trenches 202. In an embodiment of the present disclosure, materials of the protective layers 203 are selected from, but not limited to, silicon oxide, silicon nitride, and silicon oxynitride; and the protective layers 203 are formed by means of physical vapor deposition and/or chemical vapor deposition.

Figure 3:
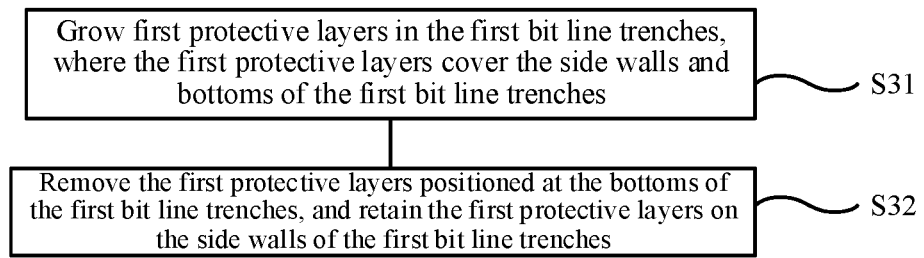
FIG. 3 is a schematic diagram showing steps of forming protective layers on side walls of the first trenches in the method for fabricating a semiconductor structure according to an embodiment of the present disclosure.
Figure 4A:
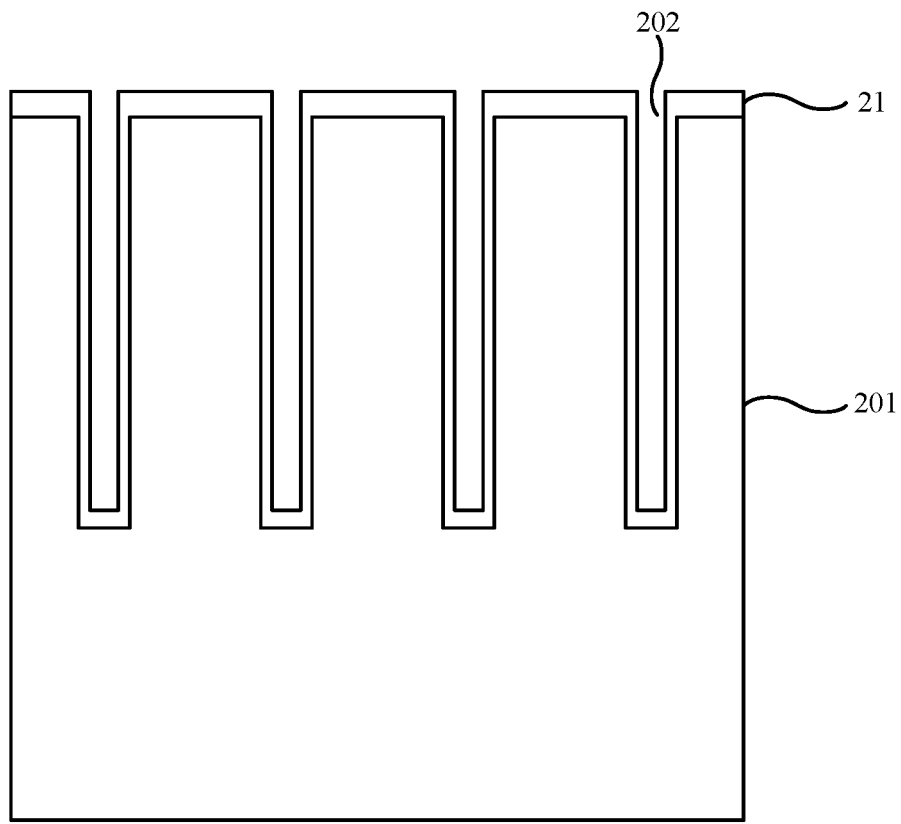
FIGS. 4A to 4B are schematic process diagrams of Steps S31 and S32 in FIG. 3.
Figure 4B:
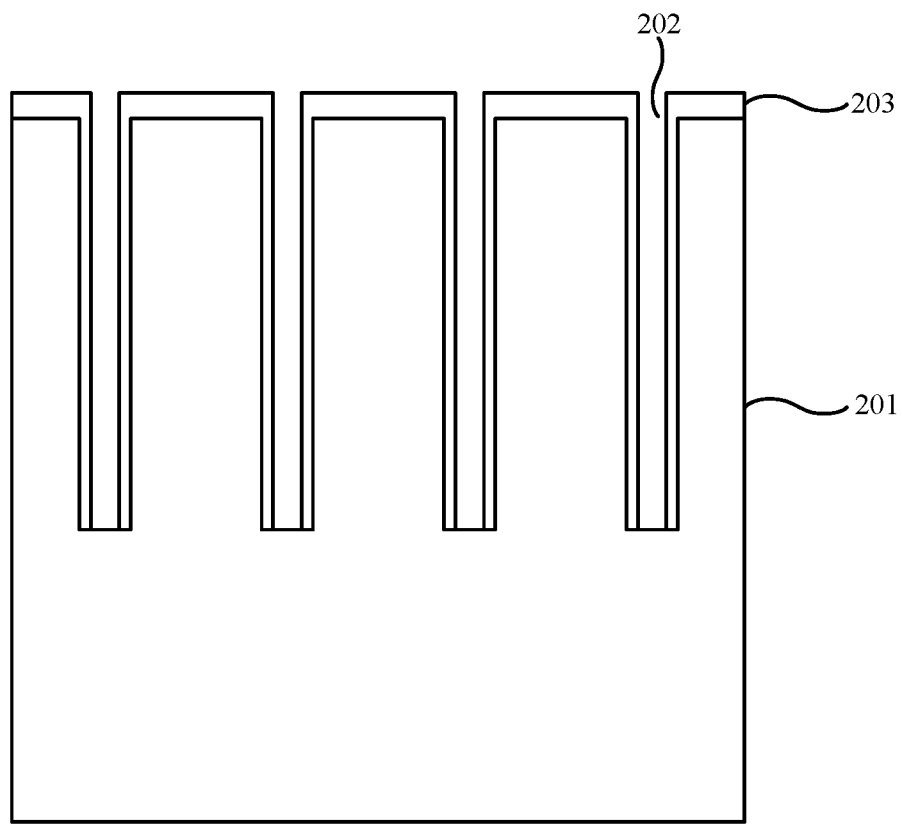

In an embodiment of the present disclosure, reference is made to FIG. 3 and FIGS. 4A-4B for a formation method of the protective layers 203.

FIG. 3 is a schematic diagram showing steps of forming the protective layers 203 on side walls of the first trenches 202 in the method for fabricating a semiconductor structure according to an embodiment of the present disclosure, including: Step S31, growing protective layers in the first trenches, the protective layers covering the side walls and bottoms of the first trenches; and Step S32, removing the protective layers positioned at the bottoms of the first trenches, and retaining the protective layers on the side walls of the first trenches.

FIGS. 4A to 4B are schematic process diagrams of Steps S31 and S32 in FIG. 3.

As shown in FIG. 4A, referring to Step S31, a protective layer 21 is grown in the first trench 202, where the protective layer 21 covers the side walls and the bottom of the first trench 202. In an embodiment of the present disclosure, material of the protective layer 21 is selected from, but not limited to, silicon oxide, silicon nitride, and silicon oxynitride; and the protective layer 21 is formed by means of physical vapor deposition and/or chemical vapor deposition.

As shown in FIG. 4B, referring to Step S32, the protective layer 21 at the bottom of the first trench 202 is removed, and the protective layer 21 on the side walls of the first trench 202 is retained. That is, the protective layer 203 as shown in FIG. 2B is formed. In subsequent steps, the bottom of the first trench 202 may be easily etched.

After the structure as shown in FIG. 2B is obtained, following steps are continued.

Figure 2C:
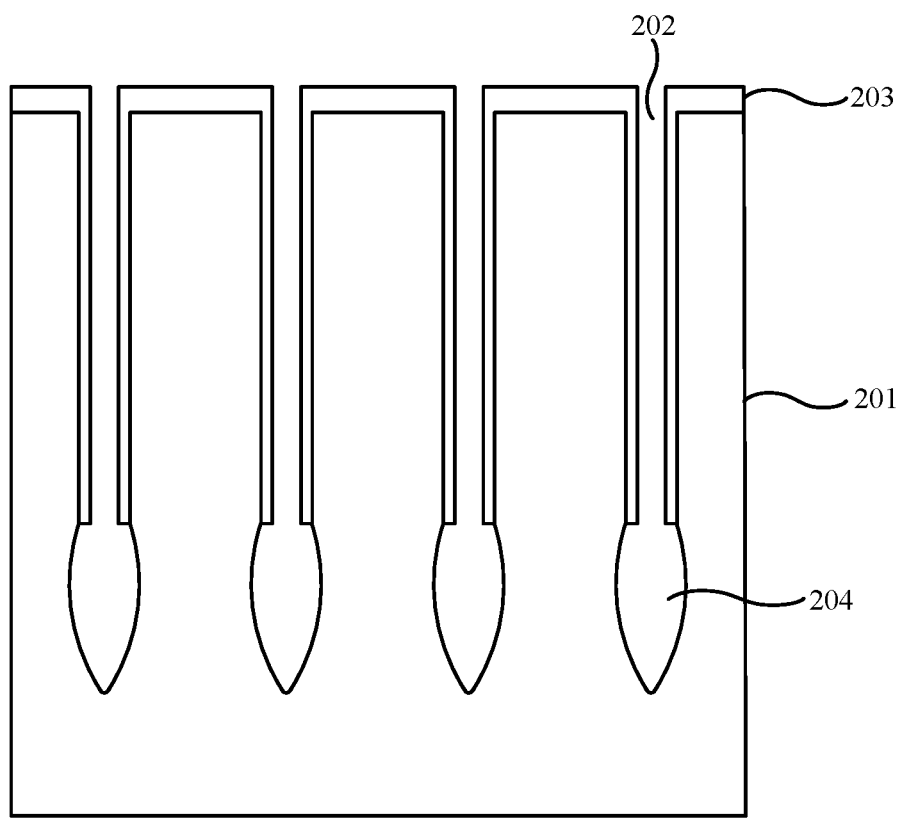

As shown in FIG. 2C, referring to Step S12, a second trench 204 is formed at the bottom of the first trench 202, where a width of the second trench 204 is greater than that of the first trench 202. In an embodiment of the present disclosure, the second trench 204 is positioned below the first trench 202, and the second trench 204 is shaped like an inverted water drop. The width at the widest part of the second trench 204 is greater than the width of the first trench 202. In an embodiment of the present disclosure, the second trenches 204 are formed by means of isotropic etching. The forming the second trenches 204 further includes a cleaning step. In an embodiment of the present disclosure, the cleaning step is performed after the second trenches 204 are formed by means of isotropic etching, where hydrogen fluoride (HF) is used in the cleaning step. In other embodiments of the present disclosure, the second trenches 204 may be in other shapes.

Figure 2D:
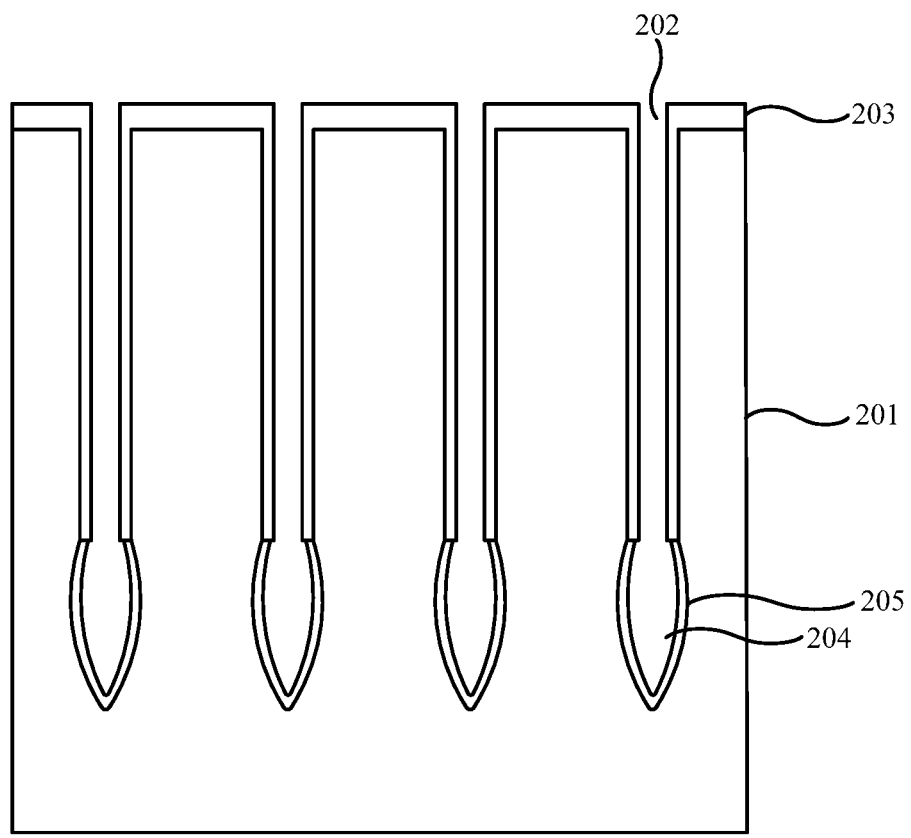

As shown in FIG. 2D, referring to Step S13, a first spacer 205 is formed on the side wall of the second trench 204 to reduce the opening size of the second trench 204. In an embodiment of the present disclosure, materials of the first spacers 205 are selected from, but not limited to, silicon oxide, silicon nitride, and silicon oxynitride; and the first spacers 205 are formed by means of physical vapor deposition and/or chemical vapor deposition. In other embodiments of the present disclosure, materials of the protective layers 203 and of the first spacers 205 are separately selected from silicon oxide, silicon nitride, and silicon oxynitride; and the protective layers 203 and the first spacers 205 are separately formed by means of physical vapor deposition and/or chemical vapor deposition.

Figure 2E:
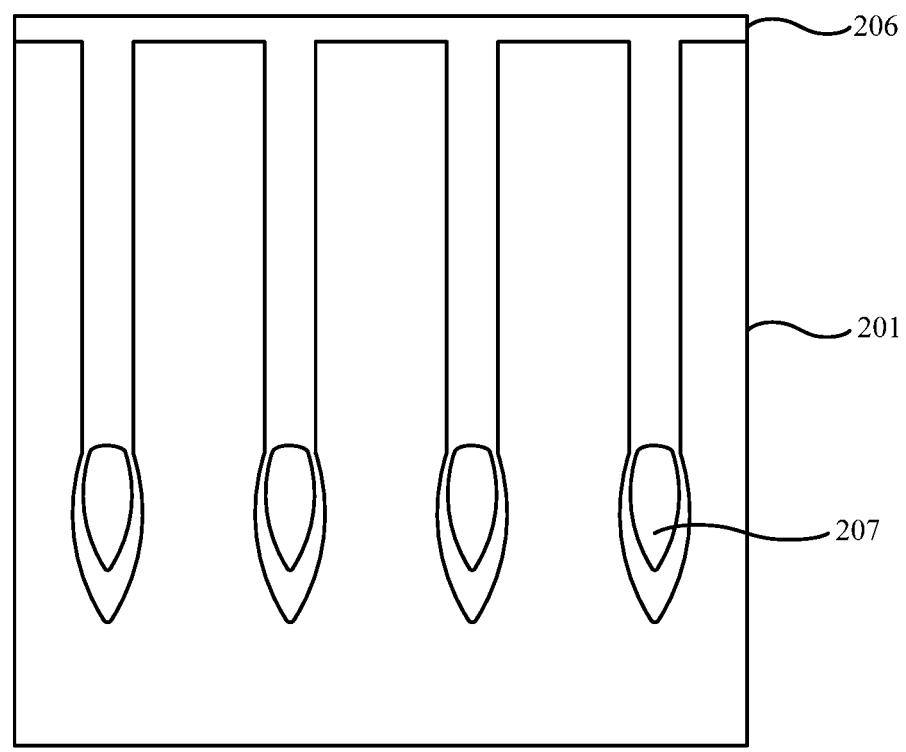

As shown in FIG. 2E, referring to Step S14, the first trenches 202 and the second trenches 204 are filled to form second spacers 206, and voids 207 are formed in the second trenches 204. The first trenches 202 and the second trenches 204 are filled by means of step coverage, the first trenches 202 are filled up, and the voids 207 are formed in the second trenches 204. In an embodiment of the present disclosure, materials the second spacers 206 are selected from, but not limited to, silicon oxide, silicon nitride, and silicon oxynitride; and the second spacers 206 are formed by means of physical vapor deposition and/or chemical vapor deposition. In other embodiments of the present disclosure, materials of the protective layers 203, of the first spacers 205 and of the second spacers 206 are separately selected from silicon oxide, silicon nitride, and silicon oxynitride. The protective layers 203, the first spacers 205 and the second spacers 206 are separately formed by means of physical vapor deposition and/or chemical vapor deposition. In this embodiment, the second spacers 206, the protective layers 203 and the first spacers 205 are made of the same material and are blended with each other. In other embodiments of the present disclosure, the second spacers 206 may also be made of a material different from materials of the protective layers 203 and of the first spacers 205, and present a layered effect.

Figure 2F:
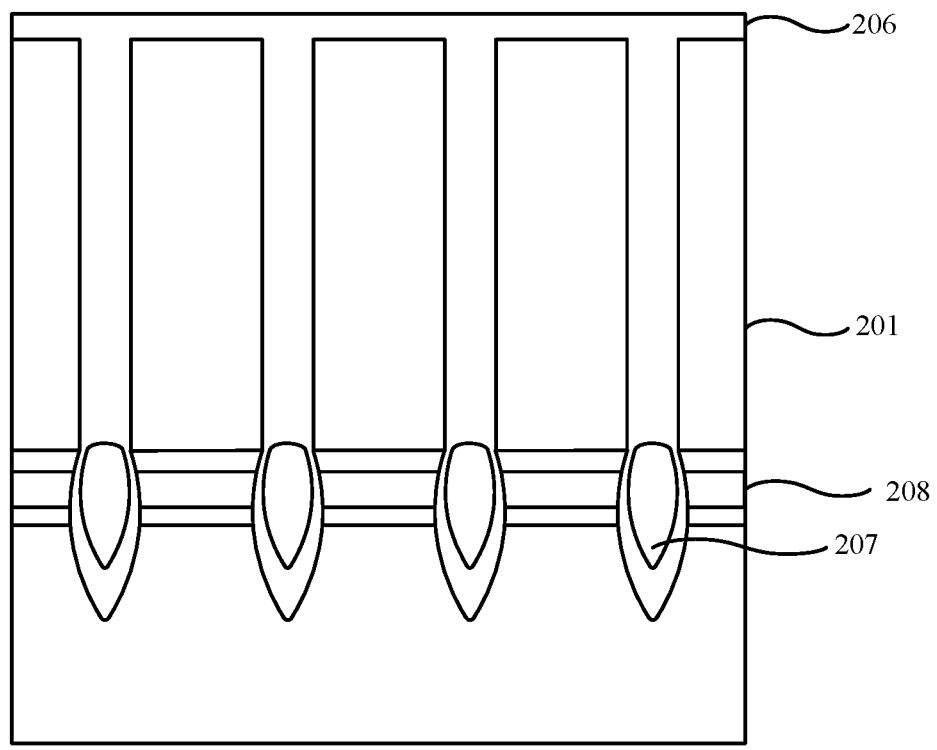

As shown in FIG. 2F, referring to Step S15, third trenches 208 are formed in the substrate 201, and the third trenches 208 are perpendicular to the first trenches 202. In an embodiment of the present disclosure, the third trenches 208 are formed by means of dry etching and/or wet etching. In a subsequent step, the third trenches 208 are configured to form bit lines.

Figure 5A:
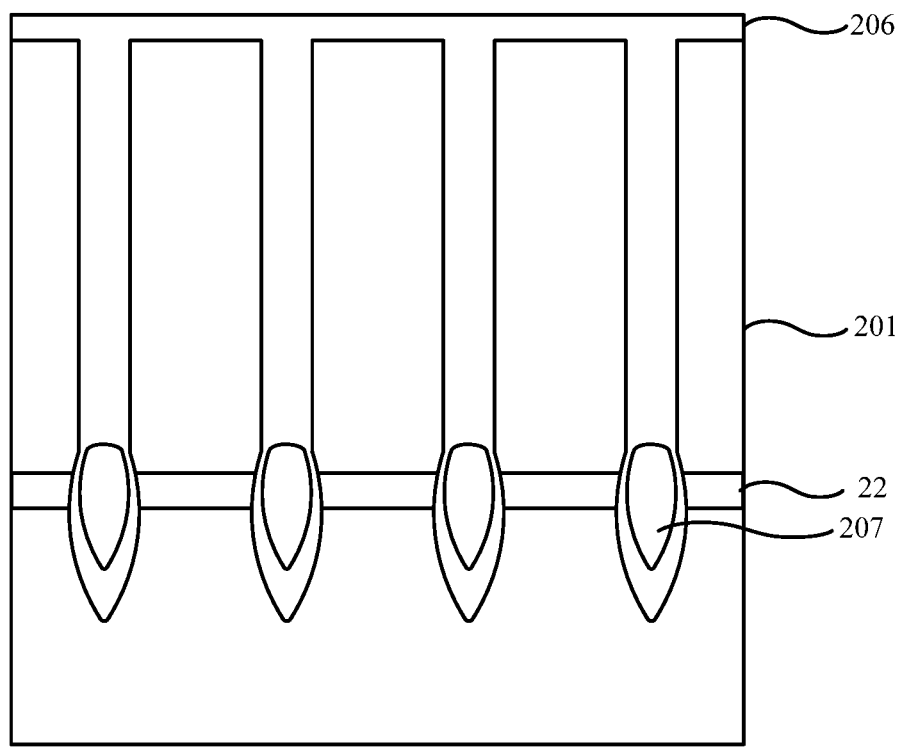
FIG. 5A and FIG. 5B are schematic process diagrams of twice expansion of the third trenches in the method for fabricating a semiconductor structure according to an embodiment of the present disclosure.
Figure 5B:
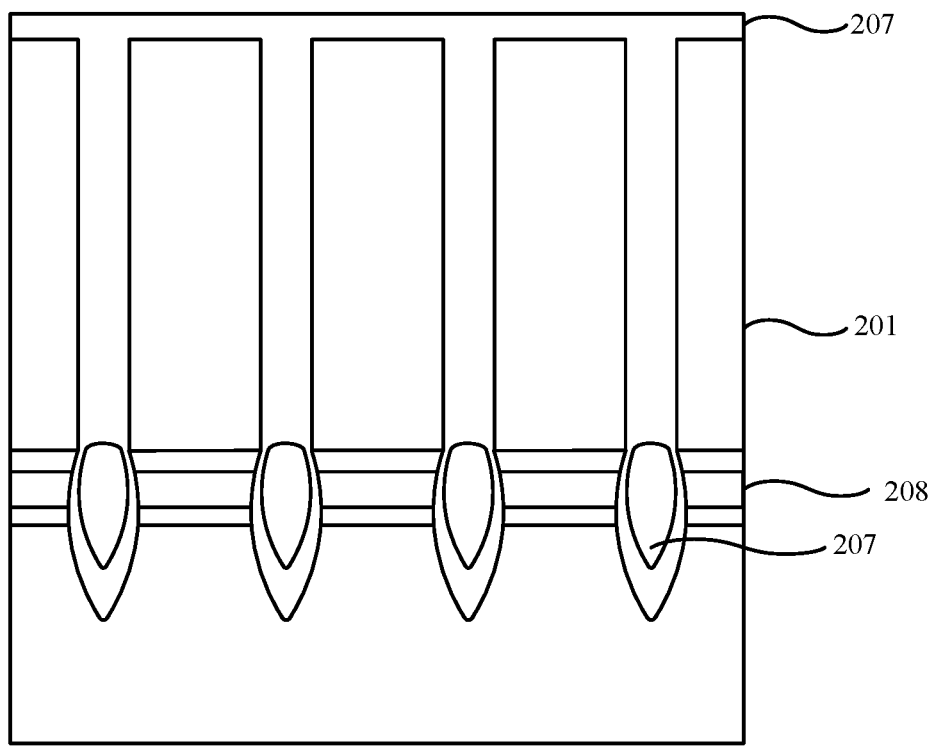

In an embodiment of the present disclosure, the third trenches 208 are formed by means of twice expansion. In an embodiment of the present disclosure, the twice expansion is implemented by means of dry etching and/or wet etching. FIG. 5A and FIG. 5B are schematic process diagrams of twice expansion of the third trenches in the method for fabricating a semiconductor structure according to an embodiment of the present disclosure. FIG. 5A is a schematic diagram before twice expansion of the third trenches 208. To better form the bit lines in a subsequent process, the twice expansion is required to be performed for the third trenches 22. FIG. 5B is a schematic diagram after the twice expansion of the third trenches 208.

After the structure as shown in FIG. 2F is obtained, following steps are continuously performed.

Figure 2G:
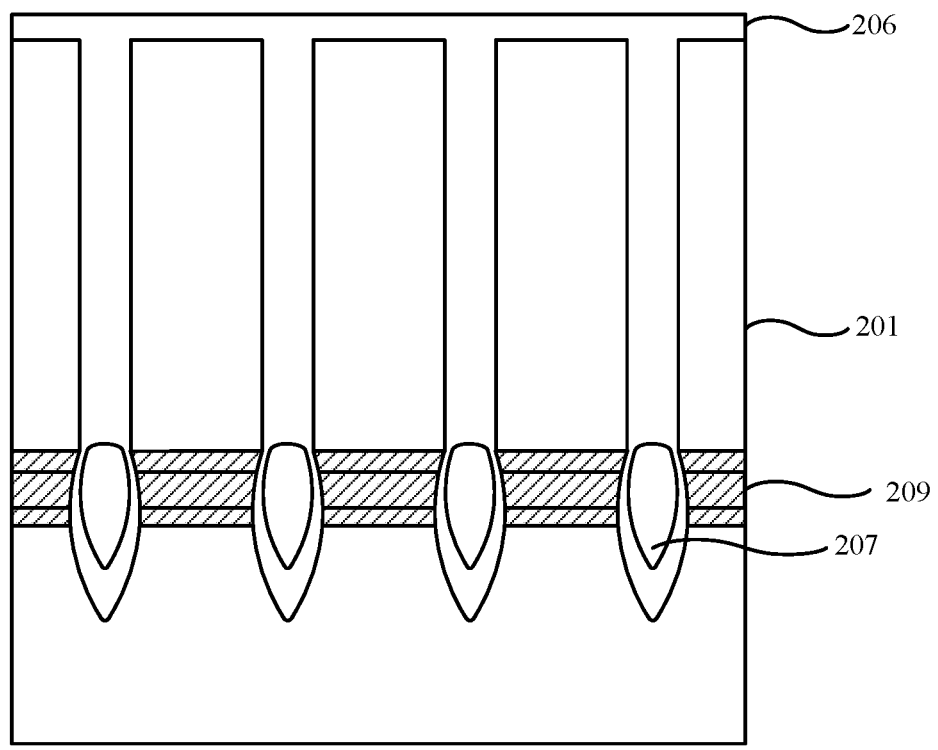

As shown in FIG. 2G, referring to Step S16, bit lines 209 are formed in the third trenches 208. The bit lines 209 are made of metal silicide. In an embodiment of the present disclosure, the bit lines 209 are made of cobalt silicide.

The step of forming the bit lines 209 further includes: depositing metal layers in the third trenches 208, and contacting the substrate 201 by means of isotropic diffusion to form metal silicides; and removing unreacted metal layers to form the bit lines 209. In an embodiment of the present disclosure, the step of forming the bit lines 209 further includes: depositing cobalt layers in the third trenches 208, and contacting the substrate 201 by means of isotropic diffusion to form cobalt silicide; and removing the cobalt layers unreacted to form the bit lines 209. The bit lines 209 are made of cobalt silicide.

Figure 6:
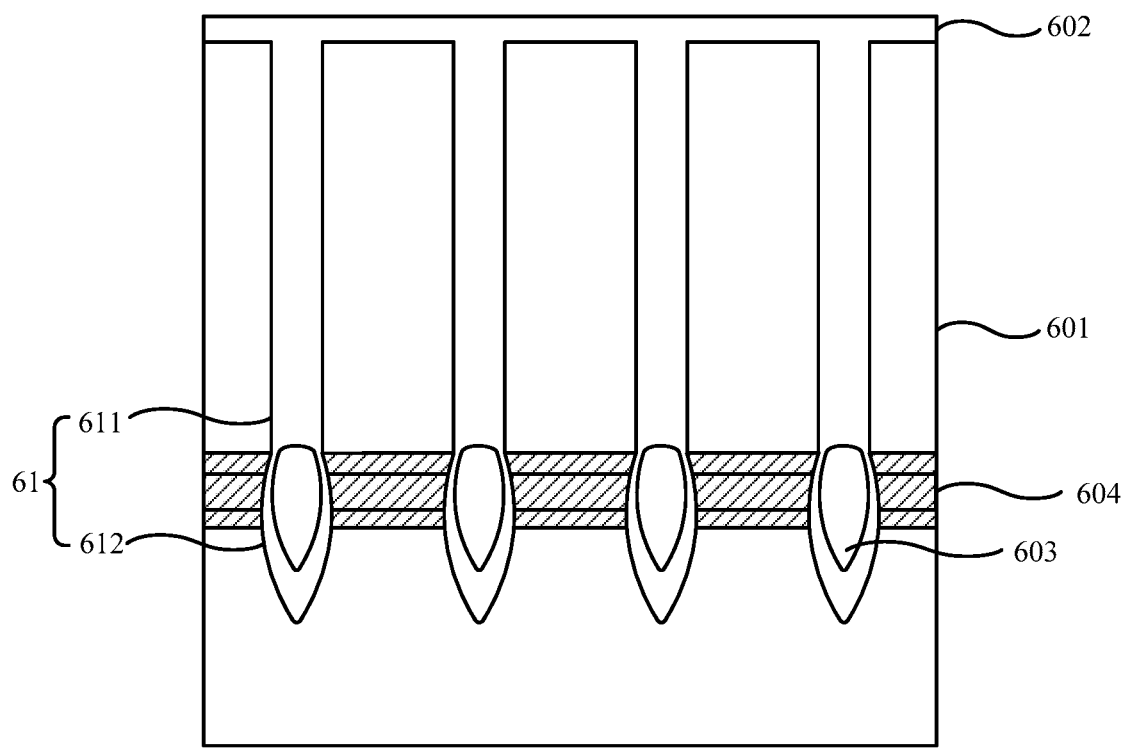
FIG. 6 is a schematic diagram of a semiconductor structure according to an embodiment of the present disclosure.

FIG. 6 is a schematic diagram of a semiconductor structure according to an embodiment of the present disclosure after the above steps are completed. The semiconductor structure includes: a substrate 601, spacers 602, and bit lines 604. The substrate 601 is provided with bit line trenches 61 arranged in a same direction, where the bit line trenches 61 include first trenches 611 and second trenches 612, and the second trenches 612 are positioned below the first trenches 611 and are communicated with the first trenches 611. The spacers 602 fill the bit line trenches 61, and the spacers 602 have voids 603 therein. The bit lines 604 are arranged between adjacent bit line trenches 61 and are separated by the spacers 602.

In an embodiment of the present disclosure, the bit lines trenches 61 are formed by means of isotropic etching. The second trenches 612 are shaped like inverted water drops, and widest parts of the second trenches 612 are wider than the first trenches 611. In other embodiments of the present disclosure, the second trenches 612 may be in other shapes. In an embodiment of the present disclosure, the second trenches 612 are formed by means of isotropic etching. In an embodiment of the present disclosure, the first trenches 611 are obtained by means of dry etching and/or wet etching. A cleaning step is also required after the step of etching the bit line trenches 61 is completed, and HF is used in the cleaning step.

In an embodiment of the present disclosure, the voids 603 are arranged in a part of the spacers 602 of the second trenches 612. Materials of the spacers 602 are selected from silicon oxide, silicon nitride, and silicon oxynitride. The spacers 602 are formed by means of one or more of physical vapor deposition, chemical vapor deposition, and step coverage. In this embodiment, the spacers 602 are formed by one material. In other embodiments of the present disclosure, the spacers 602 may also be formed by a variety of different materials, and present a layered effect. The voids 603 are arranged in the spacers 602, thereby reducing the parasitic capacitance of the bit lines, and improving the electric stability of the semiconductor structure.

The bit lines 604 are made of metal silicide. In an embodiment of the present disclosure, the bit lines 604 are made of cobalt silicide.

According to the above technical solutions, the spacers 602 having the voids 603 are introduced into the bit line trenches 61, to reduce the parasitic capacitance of the bit lines and improve the electric stability of the semiconductor structure.

In another embodiment of the present disclosure, the second trenches may be in other shapes different from inverted water drops. FIGS. 7A to 7G are schematic process diagrams of Steps S10 to S16 in FIG. 1 according to another embodiment.

Figure 7A:
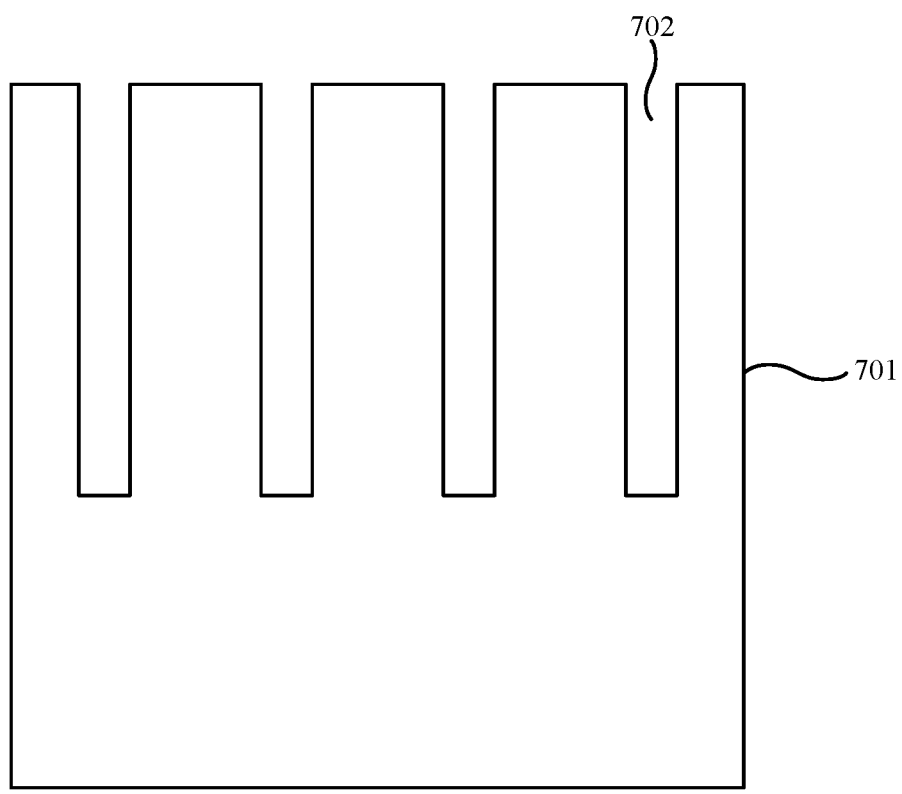
FIGS. 7A to 7G are schematic process diagrams of Steps S10 to S16 in FIG. 1.

As shown in FIG. 7A, referring to Step S10, a substrate 701 is provided, and the substrate 701 is provided with first trenches 702 arranged in a same direction. In an embodiment of the present disclosure, the substrate 701 is a Si substrate. In other embodiments of the present disclosure, the substrate 701 may also be made of common substrate materials in the field of semiconductors such as sapphire, silicon carbide, and gallium nitride. In an embodiment of the present disclosure, the first trenches 702 are obtained by means of dry etching and/or wet etching.

Figure 7B:
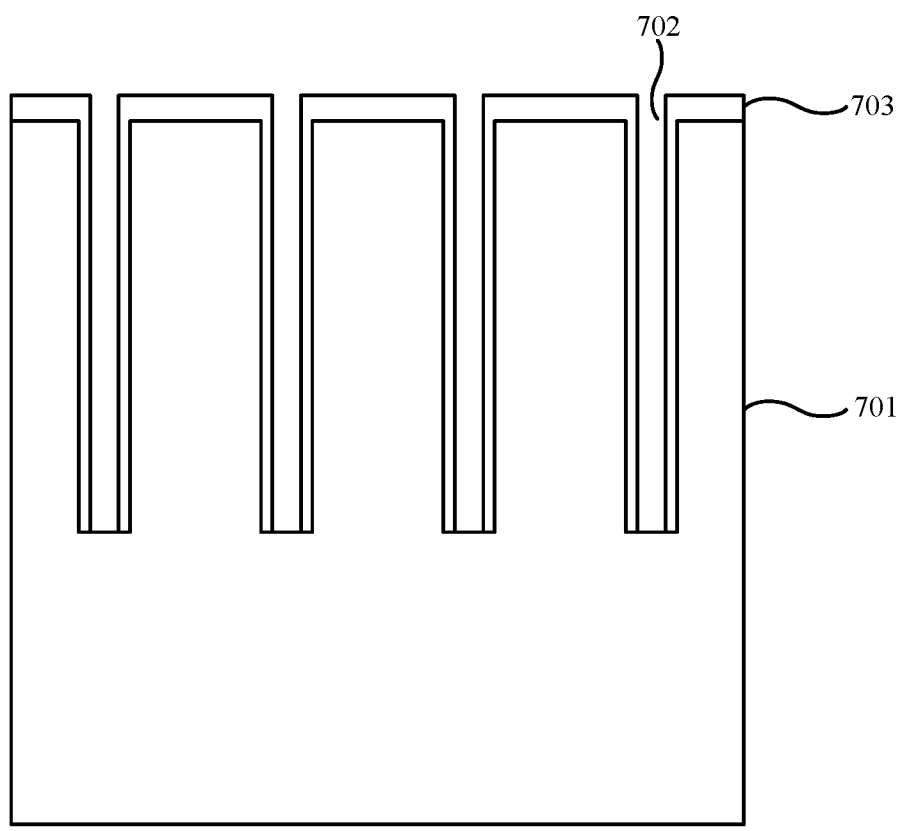

As shown in FIG. 7B, referring to Step S11, protective layers 703 are formed on side walls of the first trenches 702. In an embodiment of the present disclosure, material of the protective layer 703 is selected from, but not limited to, silicon oxide, silicon nitride, and silicon oxynitride; and the protective layer 703 is formed by means of physical vapor deposition and/or chemical vapor deposition.

Figure 7C:
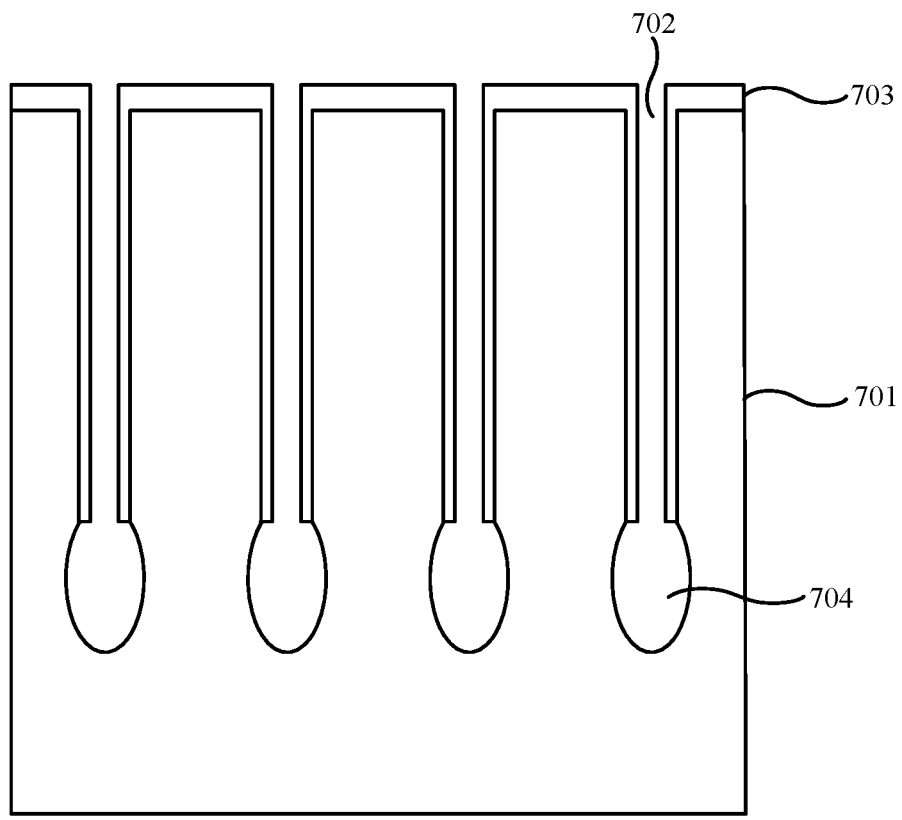

As shown in FIG. 7C, referring to Step S12, second trenches 704 are formed at bottoms of the first trenches 702, and the second trenches 704 are wider than the first trenches 702. In an embodiment of the present disclosure, the second trenches 704 are positioned below the first trenches 702, and the second trenches 704 are shaped like ellipses. Widest parts of the second trenches 704 are wider than the first trenches 702. That is, short-axis lengths of ellipses are greater than widths of the first trenches 702. In an embodiment of the present disclosure, the second trenches 704 are formed by means of isotropic etching. The forming the second trenches 704 further includes a cleaning step. In an embodiment of the present disclosure, the cleaning step is performed after the second trenches 704 are formed by means of isotropic etching, where hydrogen fluoride (HF) is used in the cleaning step. In other embodiments of the present disclosure, the second trenches 704 may be in other shapes.

Figure 7D:
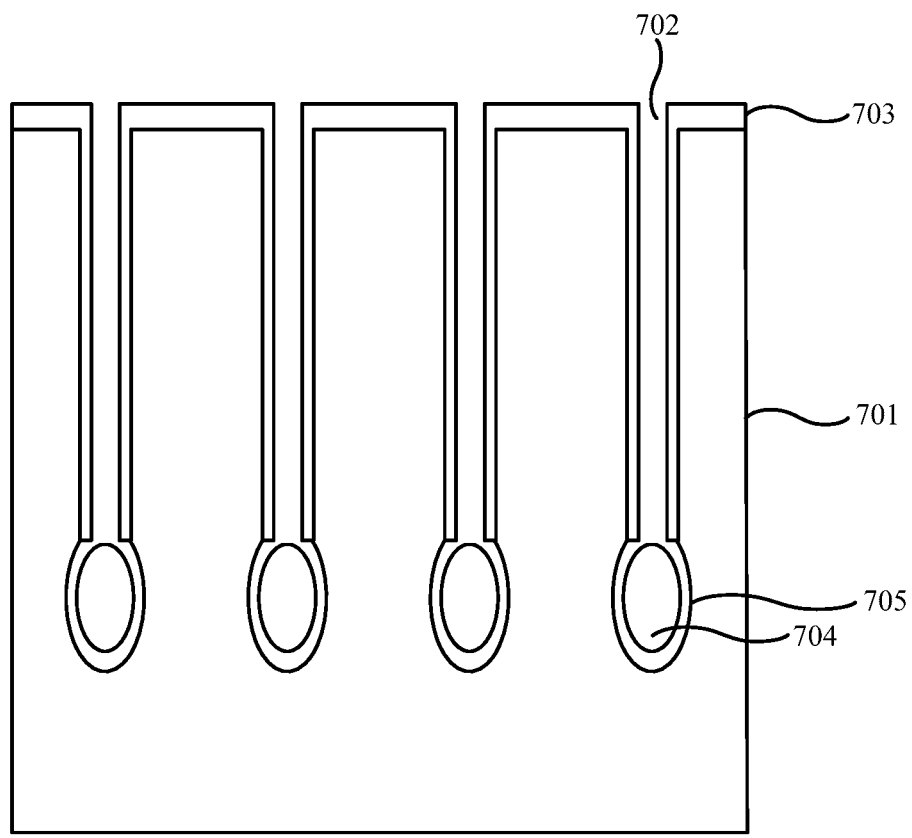

As shown in FIG. 7D, referring to Step S13, first spacers 705 are formed on side walls of the second trenches 704 to reduce opening sizes of the second trenches 204. In an embodiment of the present disclosure, materials of the first spacers 205 are selected from, but not limited to, silicon oxide, silicon nitride, and silicon oxynitride; and the first spacers 705 are formed by means of physical vapor deposition and/or chemical vapor deposition. In other embodiments of the present disclosure, materials of the protective layers 703 and of the first spacers 705 are separately selected from silicon oxide, silicon nitride, and silicon oxynitride; and the protective layers 703 and the first spacers 705 are separately formed by means of physical vapor deposition and/or chemical vapor deposition.

Figure 7E:
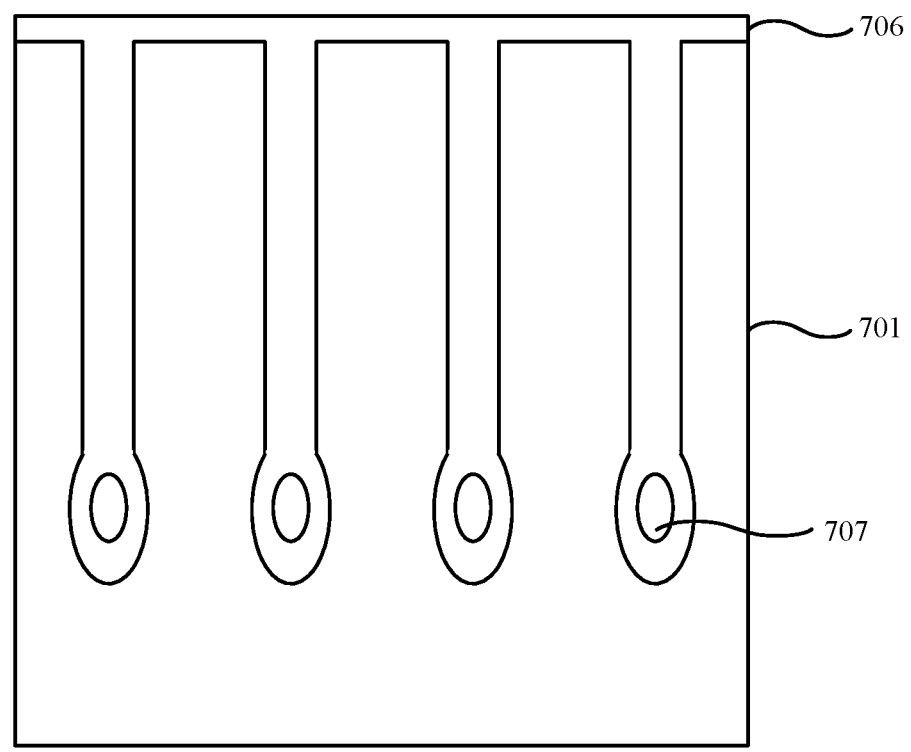

As shown in FIG. 7E, referring to Step S14, the first trenches 702 and the second trenches 704 are filled to form second spacers 706, and voids 707 are formed in the second trenches 704. The first trenches 702 and the second trenches 704 are filled by means of step coverage, the first trenches 702 are filled up, and the voids 707 are formed in the second trenches 704. In an embodiment of the present disclosure, materials the second spacers 706 are selected from, but not limited to, silicon oxide, silicon nitride, and silicon oxynitride; and the second spacers 706 are formed by means of physical vapor deposition and/or chemical vapor deposition. In other embodiments of the present disclosure, materials of the protective layers 703, of the first spacers 705 and of the second spacers 706 are separately selected from silicon oxide, silicon nitride, and silicon oxynitride. The protective layers 703, the first spacers 705 and the second spacers 706 are separately formed by means of physical vapor deposition and/or chemical vapor deposition. In this embodiment, the second spacers 706, the protective layers 703 and the first spacers 705 are made of the same material and are blended with each other. In other embodiments of the present disclosure, the second spacers 706 may also be made of a material different from materials of the protective layers 703 and of the first spacers 705, and present a layered effect.

Figure 7F:
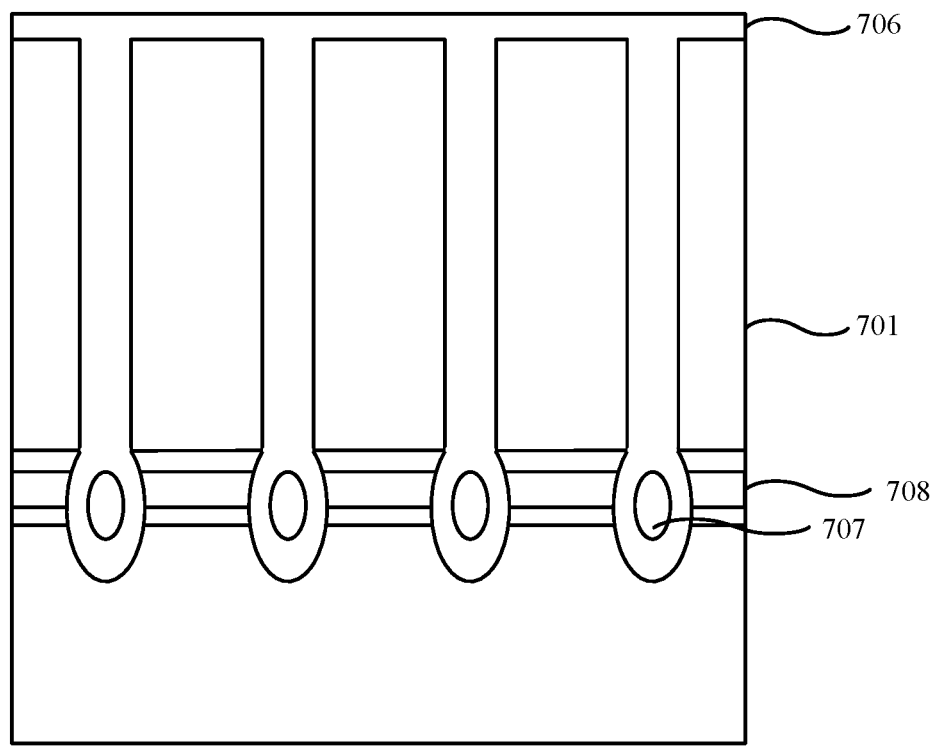

As shown in FIG. 7F, referring to Step S15, third trenches 708 are formed in the substrate 701, and the third trenches 708 are perpendicular to the first trenches 702. In an embodiment of the present disclosure, the third trenches 708 are formed by means of dry etching and/or wet etching. In a subsequent step, the third trenches 708 are configured to form bit lines.

Figure 8A:
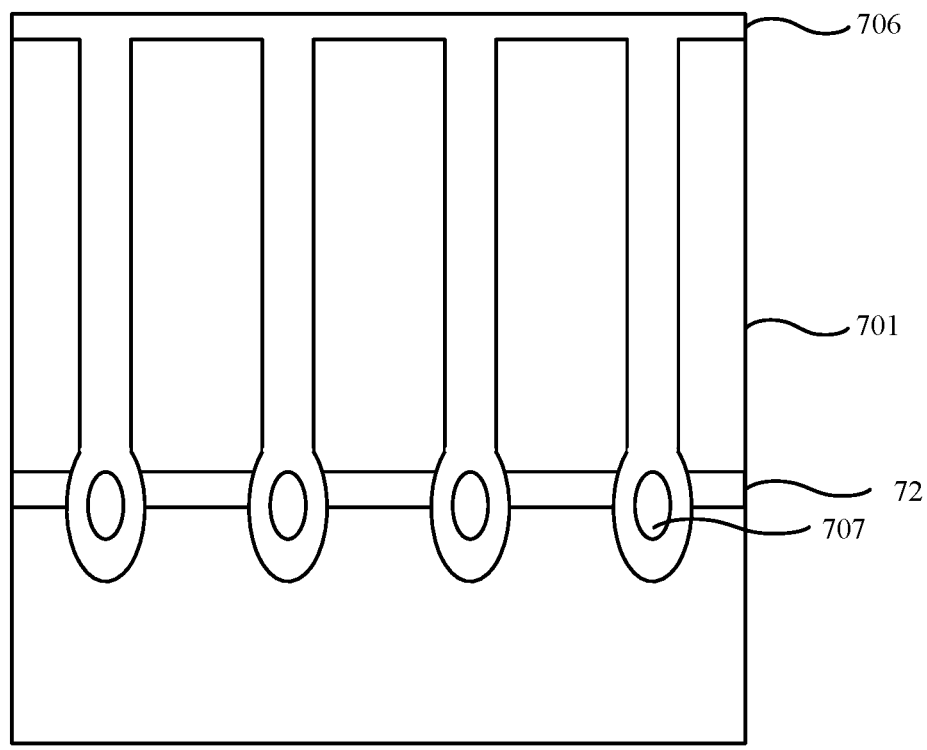
FIG. 8A and FIG. 8B are schematic process diagrams of Steps S31 and S32 in FIG. 3.
Figure 8B:
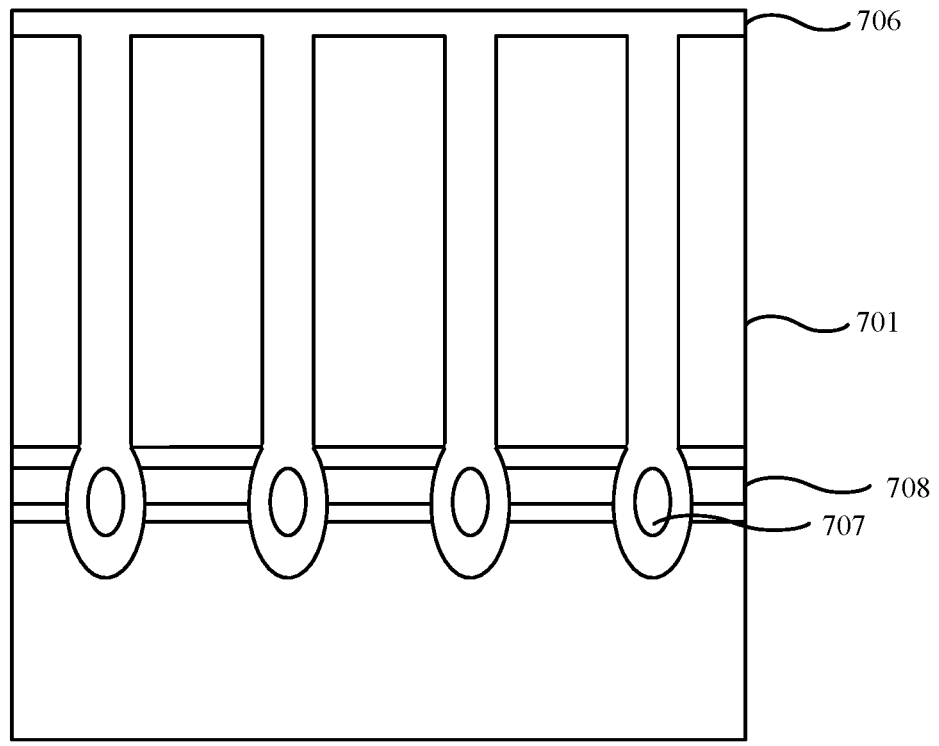

In an embodiment of the present disclosure, the third trenches 708 are formed by means of twice expansion. In an embodiment of the present disclosure, the twice expansion is implemented by means of dry etching and/or wet etching. FIG. 8A and FIG. 8B are schematic process diagrams of twice expansion of the third trenches in the method for fabricating a semiconductor structure according to an embodiment of the present disclosure. FIG. 8A is a schematic diagram before the twice expansion of the third trenches 708. To better form the bit lines in a subsequent process, the twice expansion is required to be performed for the third trenches 72. FIG. 8B is a schematic diagram after the twice expansion of the third trenches 708.

After the structure as shown in FIG. 7F is obtained, following steps are continuously performed.

Figure 7G:
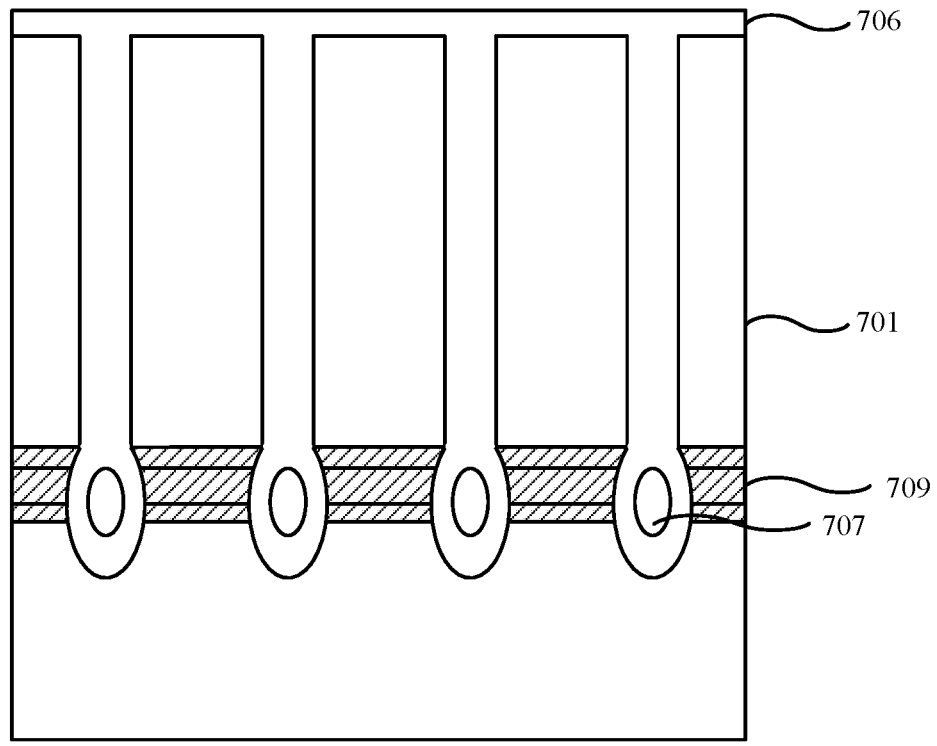

As shown in FIG. 7G, referring to Step S16, bit lines 709 are formed in the third trenches 708. The bit lines 709 are made of metal silicide. In an embodiment of the present disclosure, the bit lines 709 are made of cobalt silicide.

The step of forming the bit lines 709 further includes: depositing metal layers in the third trenches 708, and contacting the substrate 701 by means of isotropic diffusion to form metal silicides; and removing unreacted metal layers to form the bit lines 709. In an embodiment of the present disclosure, the step of forming the bit lines 709 further includes: depositing cobalt layers in the third trenches 708, and contacting the substrate 701 by means of isotropic diffusion to form cobalt silicide; and removing the cobalt layers unreacted to form the bit lines 709. The bit lines 709 are made of cobalt silicide.

Figure 9:
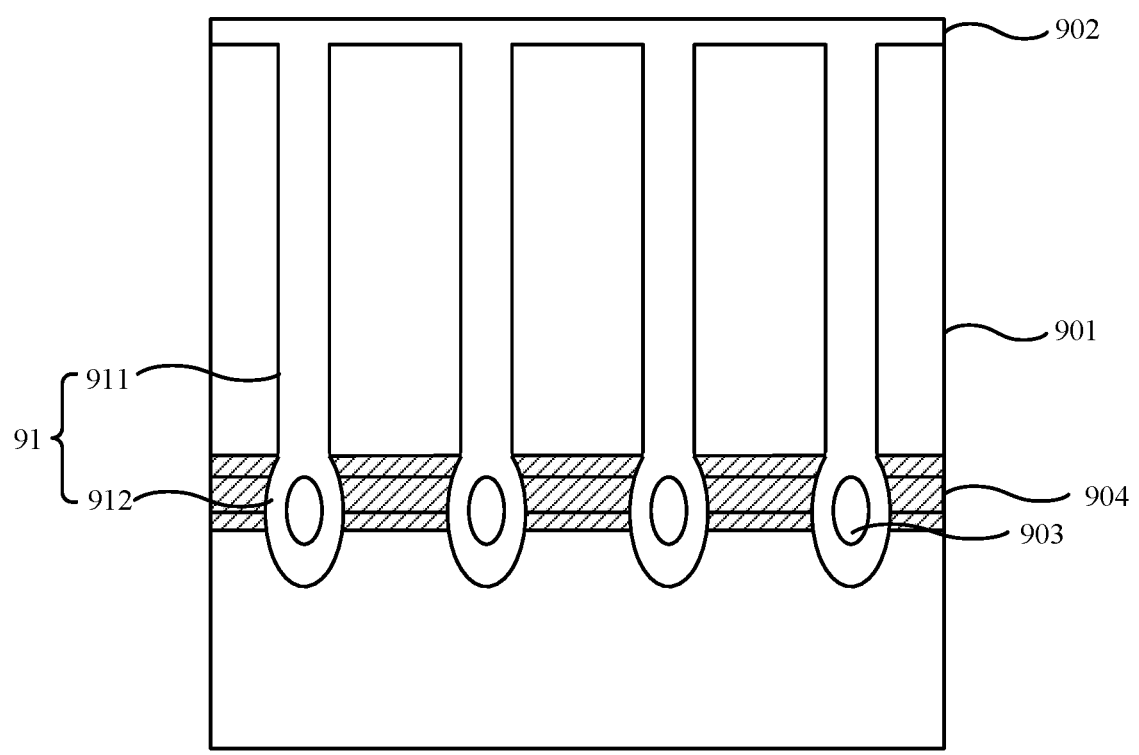
FIG. 9 is a schematic diagram of a semiconductor structure according to an embodiment of the present disclosure.

FIG. 9 is a schematic diagram of a semiconductor structure according to an embodiment of the present disclosure after the above steps are completed. The semiconductor structure includes: a substrate 901, spacers 902, and bit lines 904. The substrate 901 is provided with bit line trenches 91 arranged in a same direction, where the bit line trenches 91 include first trenches 911 and second trenches 912, and the second trenches 912 are positioned below the first trenches 911 and are communicated with the first trenches 911. The spacers 902 fill the bit line trenches 91, and the spacers 902 have voids 903 therein. The bit lines 904 are arranged between adjacent bit line trenches 91 and are separated by the spacers 902.

In an embodiment of the present disclosure, the bit lines trenches 91 are formed by means of isotropic etching. The second trenches 912 are shaped like ellipses. The widest parts of the second trenches 912 are wider than the first trenches 911. That is, short-axis lengths of the ellipses are greater than the widths of the first trenches 911. In other embodiments of the present disclosure, the second trenches 912 may be in other shapes. In an embodiment of the present disclosure, the second trenches 912 are formed by means of isotropic etching. In an embodiment of the present disclosure, the first trenches 911 are obtained by means of dry etching and/or wet etching. A cleaning step is also required after the step of etching the bit line trenches 91 is completed, and HF is used in the cleaning step.

In an embodiment of the present disclosure, the voids 903 are arranged in a part of the spacers 902 of the second trenches 912. The spacers 902 are made of silicon oxide, silicon nitride, or silicon oxynitride. The spacers 902 are formed by means of one or more of physical vapor deposition, chemical vapor deposition, and step coverage. In this embodiment, the spacers 902 are formed by one material. In other embodiments of the present disclosure, the spacers 902 may also be formed by a variety of different materials, and present a layered effect. The voids 903 are arranged in the spacers 902, thereby reducing the parasitic capacitance of the bit lines, and improving the electric stability of the semiconductor structure.

The bit lines 904 are made of metal silicide. In an embodiment of the present disclosure, the bit lines 904 are made of cobalt silicide.

According to the above technical solutions, the spacers 902 having the voids 903 are introduced into the bit line trenches 91, to reduce the parasitic capacitance of the bit lines and improve the electric stability of the semiconductor structure.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A method for fabricating a semiconductor structure, comprising:
   providing a substrate, the substrate being provided with first trenches arranged in a same direction;
   forming protective layers on side walls of the first trenches;
   forming second trenches at bottoms of the first trenches, the second trenches being wider than the first trenches;
   forming first spacers on side walls of the second trenches to reduce opening sizes of the second trenches;
   filling the first trenches and the second trenches to form second spacers, and forming voids in the second trenches;
   forming third trenches in the substrate, the third trenches being perpendicular to the first trenches; and
   forming bit lines in the third trenches.

2. The method for fabricating a semiconductor structure according to claim 1, wherein the forming bit lines comprises:
   depositing metal layer in the third trenches, and contacting the substrate by means of isotropic diffusion to form metal silicide; and
   removing unreacted metal layer to form the bit lines.

3. The method for fabricating a semiconductor structure according to claim 1, wherein the third trenches are formed by means of twice expansion.

4. The method for fabricating a semiconductor structure according to claim 1, wherein the protective layers, the first spacers, and the second spacers are separately formed by means of physical vapor deposition and/or chemical vapor deposition.

5. The method for fabricating a semiconductor structure according to claim 1, wherein the second trenches are formed by means of isotropic etching.

6. The method for fabricating a semiconductor structure according to claim 1, wherein the second trenches are positioned below the first trenches, the second trenches being shaped like inverted water drops.

7. The method for fabricating a semiconductor structure according to claim 1, wherein the forming second trenches further comprises cleaning.

8. The method for fabricating a semiconductor structure according to claim 7, wherein hydrogen fluoride (HF) is used in the cleaning.

9. The method for fabricating a semiconductor structure according to claim 1, wherein the first trenches and the second trenches are filled by means of step coverage, the first trenches are filled up, and voids are formed in the second trenches.

10. The method for fabricating a semiconductor structure according to claim 1, wherein materials of the protective layers, of the first spacers and of the second spacers are separately selected from silicon oxide, silicon nitride, and silicon oxynitride.

11. The method for fabricating a semiconductor structure according to claim 1, wherein the forming protective layers on side walls of the first trenches further comprises:
    growing the protective layers in the first trenches, the protective layers covering the side walls and bottoms of the first trenches; and
    removing the protective layers positioned at the bottoms of the first trenches, and retaining the protective layers on the side walls of the first trenches.

12. A semiconductor structure, comprising:
    a substrate, the substrate being provided with bit line trenches arranged in a same direction, the bit line trenches comprising first trenches and second trenches, and the second trenches being positioned below the first trenches and being communicated with the first trenches;
    spacers, the spacers being filled into the bit line trenches, and the spacers having voids; and
    bit lines arranged between the bit line trenches and separated by the spacers; and
    wherein the second trenches are shaped like inverted water drops.

13. The semiconductor structure according to claim 12, wherein the bit line trenches are formed by means of isotropic etching.

14. The semiconductor structure according to claim 12, wherein the voids are provided in a part of the spacers of the second trenches.

15. The semiconductor structure according to claim 12, wherein material of the bit lines is metal silicide.

16. The semiconductor structure according to claim 12, wherein the spacers are formed by means of one or more methods of physical vapor deposition, chemical vapor deposition, and step coverage.

17. The semiconductor structure according to claim 12, wherein material of the spacers is selected from silicon oxide, silicon nitride, and silicon oxynitride.

* * * * *